(12) United States Patent
Nagasaka et al.

(10) Patent No.: US 7,417,716 B2
(45) Date of Patent: Aug. 26, 2008

(54) MULTIPLE RANGING APPARATUS

(75) Inventors: Kohji Nagasaka, Osaka (JP); Seiichi Narasako, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 416 days.

(21) Appl. No.: 11/063,590

(22) Filed: Feb. 24, 2005

(65) Prior Publication Data

US 2005/0184301 A1 Aug. 25, 2005

(30) Foreign Application Priority Data

Feb. 25, 2004 (JP) .......................... P2004-049458

(51) Int. Cl.
*G01C 3/08* (2006.01)

(52) U.S. Cl. ...................... 356/4.01; 356/3.1

(58) Field of Classification Search ................ 356/3.1, 356/4.01–5.15, 28, 614, 623; 382/103, 106, 382/107; 257/440; 250/226
See application file for complete search history.

(56) References Cited

U.S. PATENT DOCUMENTS

| 4,231,533 A * | 11/1980 | Durig .................. 244/3.16 |
| 4,954,861 A | 9/1990 | Nagaoka et al. |
| 5,004,908 A * | 4/1991 | Nakamura .................. 250/221 |
| 5,125,735 A * | 6/1992 | Oizumi et al. ............. 356/3.04 |
| 5,239,335 A * | 8/1993 | Kato .......................... 396/113 |
| 5,751,406 A * | 5/1998 | Nakazawa et al. ......... 356/3.03 |
| 6,807,295 B1 * | 10/2004 | Ono ........................... 382/154 |
| 7,161,131 B2 * | 1/2007 | Kimber ................... 250/208.2 |
| 2003/0174315 A1 * | 9/2003 | Byren et al. ............. 356/152.1 |
| 2006/0087640 A1 * | 4/2006 | Yamaguchi ............... 356/4.01 |

FOREIGN PATENT DOCUMENTS

| JP | 61-75210 A | 4/1986 |
| JP | 62-14015 A | 1/1987 |
| JP | 64-44407 U | 3/1989 |
| JP | 7-104477 B2 | 11/1995 |
| JP | 8-160290 A | 6/1996 |
| JP | 9-203631 A | 8/1997 |
| JP | 9-304054 A | 11/1997 |

* cited by examiner

*Primary Examiner*—Isam Alsomiri
(74) *Attorney, Agent, or Firm*—Birch Stewart Kolasch & Birch, LLP

(57) ABSTRACT

A multiple ranging apparatus has a light emitting section constituted by a plurality of aligned LEDs which emit light rays of wavelengths different from one another, and a light receiving section constituted by a plurality of aligned PSD parts which have wavelength sensitivities corresponding to the different wavelengths of the light rays emitted from the LEDs. Thus, even when ranging of respective points is simultaneously measured in multiple ranging measurement, it is possible to identify which LED the light is emitted from, and therefore, to simultaneously measure the distances of two or more points.

7 Claims, 10 Drawing Sheets

MULTIPLE RANGING APPARATUS

CROSS-REFERENCE TO RELATED APPLICATIONS

This nonprovisional application claims priority under 35 U.S.C. §119(a) on Patent Application No. 2004-049458 filed in Japan on Feb. 25, 2004, the entire contents of which are incorporated herein by reference.

BACKGROUND OF THE INVENTION

The present invention relates to a multiple ranging apparatus for detecting presence or absence of an object, a direction of the object, a distance to the object or the like at multiple points.

Conventionally, for this type of apparatus, there is a multiple ranging apparatus of an automatic focusing camera as shown in FIG. 19 (see JP 07-104477 B, for example). In FIG. 19, light emitted from a light emitting element 1, which is composed of e.g. a light emitting diode (LED) or a laser diode, is made into a beam for projection by an optical lens 2. When an object exists in a detectable range, the light is reflected at a point O1 (or a point O2) on a surface of the object 3 (or the object 4) located on an axis of projection of the light beam. Then, the light passes through an optical lens 5 for light reception, so that a light spot is formed at a point P1 (or a point P2) on a one-dimensional light receiving element 6 composed of e.g. a one-dimensional PSD (positive Sensitive Diode), where the point 1 (or the point 2) is on an extension of a line connecting the point O1 (or the point O2) and a center point of the optical lens 5 for light reception.

Distances of multiple points are measured with use of a plurality of light emitting elements 1 by applying the conventional distance measuring method for the optical ranging apparatus based on the principle of optical triangulation, as described in (i) and (ii) below.

i) Presence or absence of an object is detected in accordance with the amount of received light on light spots formed on the one-dimensional light receiving element 6.

ii) Distances d1, d2 from a ranging apparatus 7 to the objects 3, 4 are measured with use of change in voltage outputted from the one-dimensional light receiving element 6 according to positions of the light spots.

The conventional multiple ranging apparatus, however, has such a disadvantage as follows. In such a conventional multiple ranging apparatus as shown in FIG. 19, the one-dimensional light receiving element 6 is used as a light receiving element. In this case, when distance measuring for multiple points is simultaneously carried out, it is impossible to identify which light emitting element 1 the light is emitted from, and therefore, to measure distances to two or more points.

Accordingly, in ranging of multiple points, ranging measurements should be carried out at some time intervals in such a manner that timing of the ranging measurements may not coincide. Thus, it takes a considerable length of time to carry out the ranging.

SUMMARY OF THE INVENTION

An object of the present invention is to provide a multiple ranging apparatus by which distances to a plurality of points can simultaneously be measured.

In order to achieve the object, the present invention provides a multiple ranging apparatus comprising:

a light emitting section;

an optical lens for beam-forming light emitted from the light emitting section;

a condensing section for condensing part of light emitted from the light emitting section and diffusely reflected by an object to form light spots; and a light receiving section for outputting signals which represent amounts of received light of the light spots formed by the condensing section and positions of the light spots, wherein the light emitting section includes a wavelength multiplying unit for multiplying a wavelength of the emitted light, and the light receiving section includes a wavelength-by-wavelength light receiving unit for separating and receiving the light rays having a plurality of wavelengths multiplied by the wavelength multiplying unit.

In accordance with the above configuration, the plurality of types of light rays having the wavelengths different from one another are emitted from the light emitting section, and part of the light rays are diffusely reflected by the object. The part of the light rays are separated and received by the wavelength-by-wavelength light receiving unit of the light receiving section. Therefore, even if the plurality of types of light rays having the different wavelengths are simultaneously emitted from the light emitting section, distances to two or more points can simultaneously be measured because it is possible to obtain signals representing the amounts of received light of the light spots and the positions of the light spots on wavelength-by-wavelength basis.

In one embodiment of the present invention, the wavelength multiplying unit is formed by a plurality of light emitting elements which respectively emit light rays having wavelengths different from one another.

According to the embodiment, the multi-wavelength light rays can separately be emitted by a simple configuration where only the plurality of light emitting elements are provided which respectively have the emission wavelengths different from one another.

In one embodiment of the present invention, the wavelength multiplying unit is formed by a plurality of optical filters which permit light rays having wavelengths different from one another to pass through.

According to the embodiment, emission wavelengths of light emitting elements, which constitute the light emitting section, may be identical. Accordingly, the light rays of the multiple wavelengths can separately be emitted with use of an inexpensive constitution formed only by providing the plurality of optical filters for one or more light emitting elements which emit light of the identical emission wavelength.

In one embodiment of the present invention, the wavelength multiplying unit is formed by a spectroscopic element.

According to the embodiment, the light emitting section may be composed of one light emitting element. Accordingly, the light rays of the multiple wavelengths can separately be emitted with use of an inexpensive configuration formed only by providing the one spectroscopic element for the one light emitting element.

In one embodiment of the present invention, the spectroscopic element is formed by a prism.

According to the embodiment, the spectroscopic element can simply be constructed from the prism.

In one embodiment of the present invention, the spectroscopic element is formed by a diffraction grating.

According to the embodiment, the spectroscopic element can simply be constructed from the diffraction grating.

In one embodiment of the present invention, the light receiving section includes a plurality of PSDs.

According to the embodiment, the light rays having the wavelengths different from one another can be separated and received by the light receiving section.

In one embodiment of the present invention, the light receiving section includes a plurality of PSD parts formed by dividing one PSD.

According to the embodiment, the light receiving section can be composed of the one PSD, and an area of the light receiving section can be reduced.

In one embodiment of the present invention, the plurality of PSDs have wavelength sensitivities different from one another and constitute the wavelength-by-wavelength light receiving unit.

According to the embodiment, the light rays of the wavelengths different from one another can be separated and received more reliably. Accordingly, simultaneous measurement of distances to two or more points can be carried out more accurately.

In one embodiment of the present invention, the plurality of PSD parts have wavelength sensitivities different from one another and constitute the wavelength-by-wavelength light receiving unit.

According to the embodiment, the light rays having the wavelengths different from one another can be separated and received more reliably. Accordingly, simultaneous measurement of distances to two or more points can be carried out more accurately.

In one embodiment of the present invention, the wavelength-by-wavelength light receiving unit is formed by a plurality of optical filters which are placed on light receiving surfaces of the PSDs and which permit light rays having the wavelengths different from one another to pass through, respectively.

According to the embodiment, wavelength sensitivities of the PSDs constituting the light receiving section may be identical. Accordingly, the light rays of the wavelengths different from one another can be separated and received with use of an inexpensive configuration formed only by providing the plurality of optical filters for the plurality of PSDs that have the identical wavelength sensitivities.

In one embodiment of the present invention, the wavelength-by-wavelength light receiving unit is formed by a plurality of optical filters which are placed on light receiving surfaces of the PSD parts and which permit light rays having the wavelengths different from one another to pass through, respectively.

According to the embodiment, it is possible to make small an area of the light receiving section by using one PSD, to reduce a cost of the apparatus by using the PSD having an identical wavelength sensitivity, and to reliably separate the light rays of the wavelengths different from one another so that distance measurement can more accurately be carried out.

In one embodiment of the present invention, the wavelength-by-wavelength light receiving unit is formed by a plurality of color filters which are formed on light receiving surfaces of the PSDs and which permit light rays having the wavelengths different from one another to pass through, respectively.

According to the embodiment, the color filters are formed directly on the light receiving surfaces of the PSDs. Thus, a thickness of the multiple ranging apparatus can be reduced.

In one embodiment of the present invention, the wavelength-by-wavelength light receiving unit is formed by a plurality of color filters which are formed on light receiving surfaces of the PSD parts and which permit light rays having the wavelengths different from one another to pass through.

According to the embodiment, it is possible to make small an area of the light receiving section by using one PSD, to reduce a cost of the apparatus by using the PSD having an identical wavelength sensitivity, to reliably separate the light rays of the wavelengths different from one another so that distance measurement can more accurately be carried out, and to reduce a thickness of the multiple ranging apparatus by directly forming the color filters on the light receiving surfaces of the PSD parts.

In one embodiment of the present invention, the condensing section is formed by a convex lens.

In one embodiment of the present invention, the condensing section is formed by a toroidal lens.

According to the embodiment, light can efficiently be condensed on the light receiving section because the light can be condensed from a wider beam area in comparison with general convex lenses or the like.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention will be described in detail based on embodiments with reference to the accompanying drawings.

First Embodiment

Figure 1:
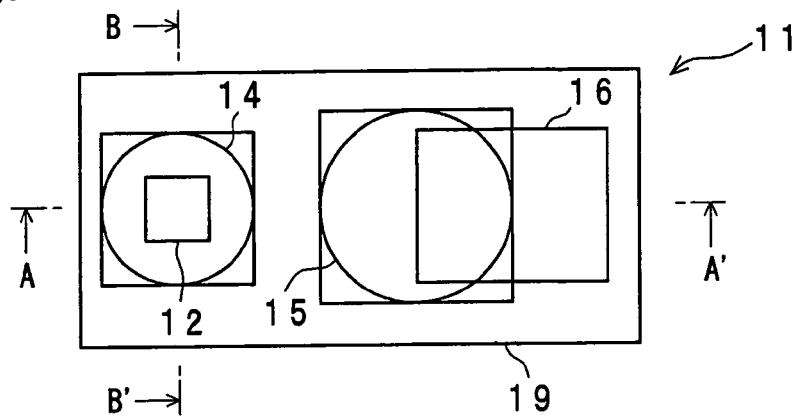
FIG. 1 is a plan view of a multiple ranging apparatus according to the present invention.
Figure 2:
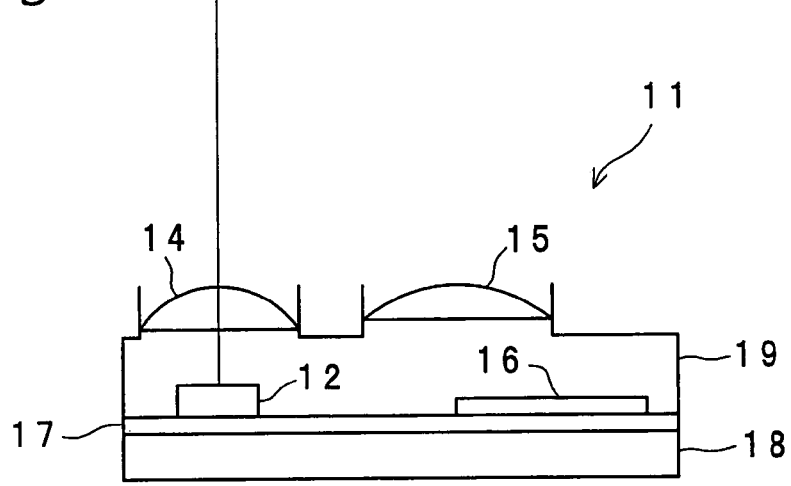
FIG. 2 is a sectional view taken along a line A-A' of FIG. 1.
Figure 3:
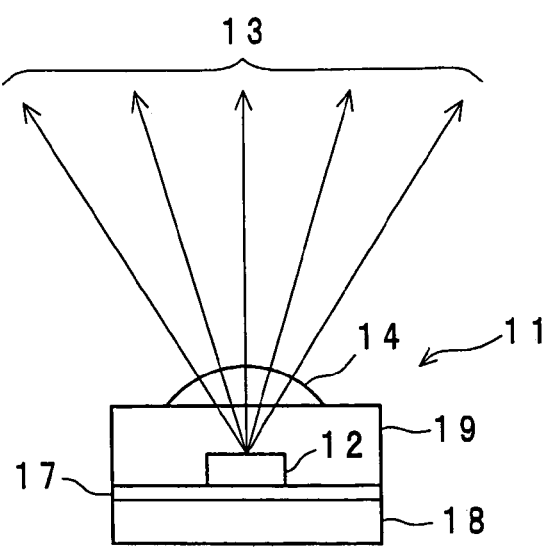
FIG. 3 is a sectional view taken along a line B-B' of FIG. 1.

FIG. 1 is a perspective plan view showing a schematic configuration of a multiple ranging apparatus of the embodiment. FIG. 2 is a sectional view taken along a line A-A' of FIG. 1. FIG. 3 is a sectional view taken along a line B-B' of FIG. 1. As shown in FIG. 3, the multiple ranging apparatus 11 has a light emitting section 12 which is capable of radiating a plurality of light rays 13 having a plurality of wavelengths. The plurality of light rays 13 radiated from the light emitting section 12 are passed through and condensed by a lens 14 and then are struck on and scattered by an object (not shown). Part of the scattered rays are condensed by a light receiving lens 15 onto a light receiving section 16, and the light rays having the plurality of wavelengths are separately received by the light receiving section 16. Reference numeral 17 denotes a frame which is formed on a substrate 18 and on which the light emitting section 12 and the light receiving section 16 are placed. Numeral 19 denotes transparent resin with which the light emitting section 12 and the light receiving section 16 are sealed.

Hereinbelow, a wavelength multiplying unit for multiplying a wavelength of light in the light emitting section 12 shown in FIG. 3, a wavelength-by-wavelength light receiving unit for separating and receiving the light rays having the plurality of wavelengths in the light receiving section 16 and the like will be described specifically with reference to examples.

FIRST EXAMPLE

Figure 4:
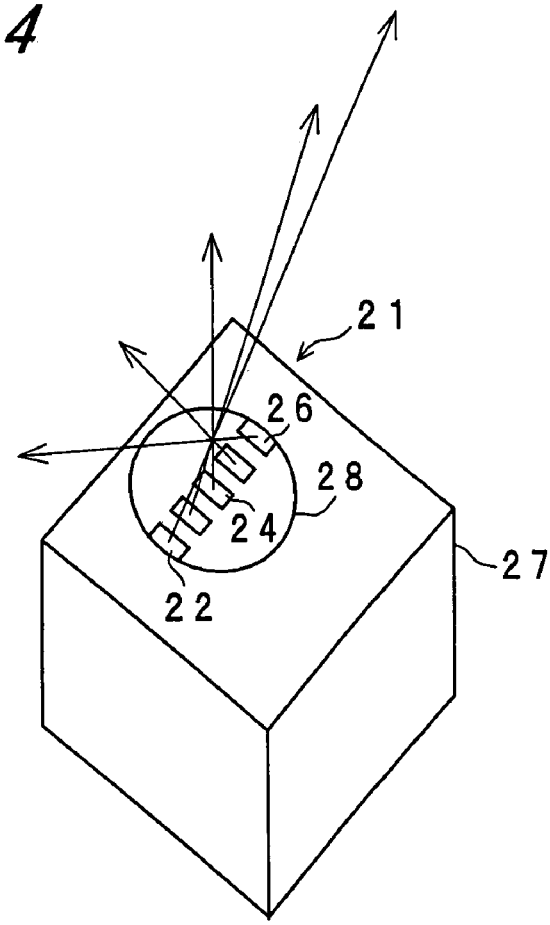
FIG. 4 is a perspective view of a light emitting device having a wavelength multiplying unit according to the present invention.
Figure 5:
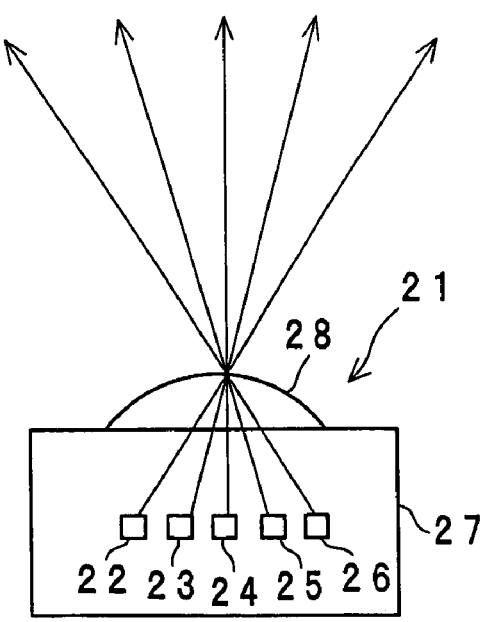
FIG. 5 is a vertical sectional view of the light emitting device shown in FIG. 4.

FIGS. 4 and 5 are a perspective view and a vertical sectional view, respectively, of a light emitting device 21 having the wavelength multiplying unit. The light emitting device 21 actually has a structure in which the light emitting section placed on the frame formed on the substrate is sealed with transparent resin, as shown in FIGS. 1 and 2. However, for simplification (ditto for second and third examples below), the light emitting section in FIGS. 4 and 5 is represented as one which is simply sealed with transparent resin.

In the light emitting device 21, five LEDs 22-26 are arranged in a row and are sealed with transparent resin 27. A lens 28 is formed on a top surface of the transparent resin 27 which is located over the LEDs 22-26. Wavelengths of light rays radiated from the LEDs 22-26 differ from one another. Chief rays from the LEDs 22-26 are on extension of lines connecting a center of the lens 28 and light emission positions of the LEDs 22-26. In the example, that is to say, the wavelength multiplying unit is composed of the plurality of the LEDs 22-26 that emit the light rays having wavelengths different from one another. The lens 28 is arranged so that a principal axis thereof is superimposed on a chief ray from the LED 24 positioned at center.

The light emitting device 21 configured as shown in FIGS. 4 and 5 is used as the light emitting section 12 and the lens 14 of the multiple ranging apparatus 11 shown in FIGS. 1 and 2. Thereby, an object can be irradiated with the light rays of the different wavelengths that are radiated from the LEDs 22-26. By using the multiple ranging apparatus 11 having such a configuration, distances to a plurality of points can be measured simultaneously.

Figure 6:
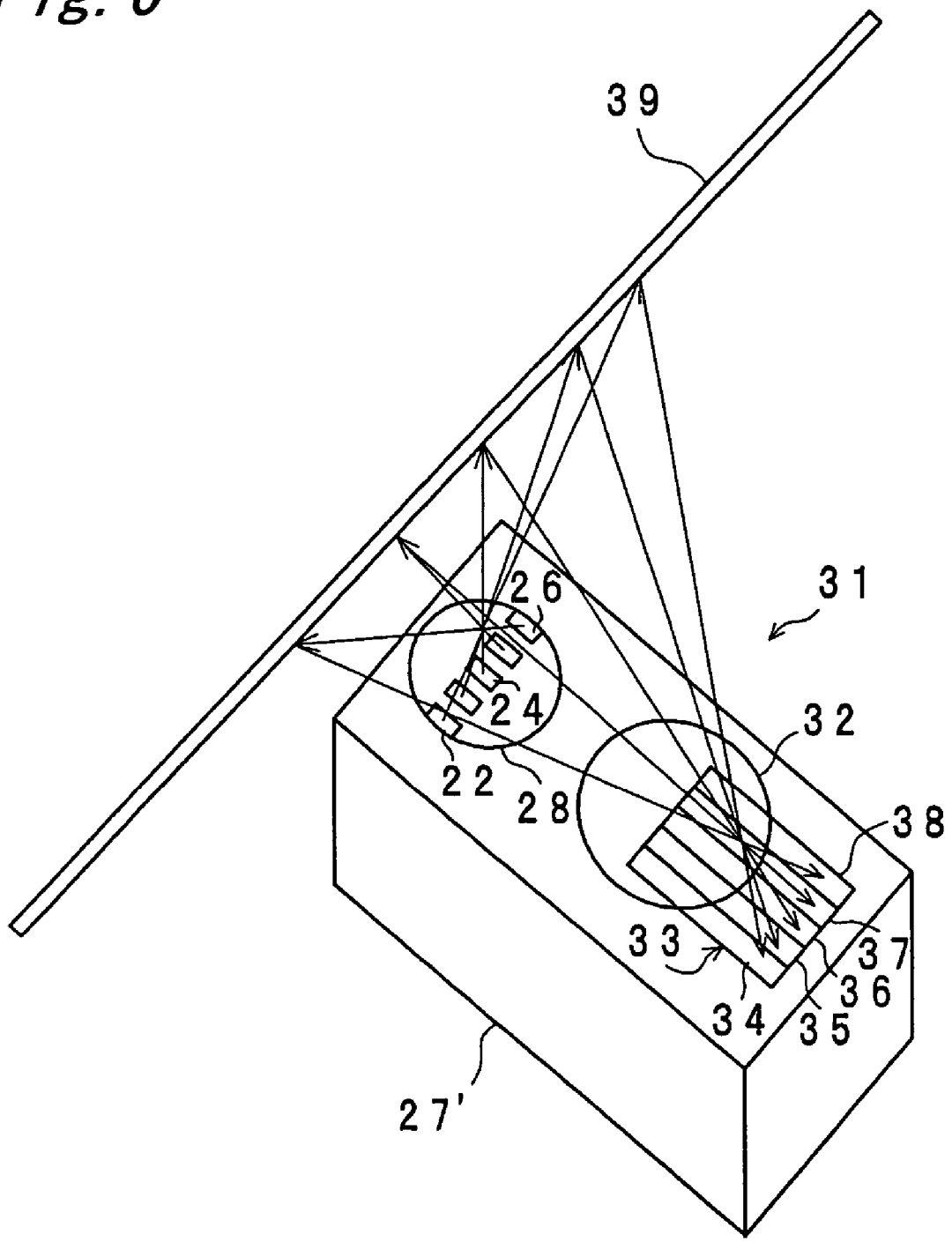
FIG. 6 is a perspective view of a multiple ranging apparatus using the light emitting device shown in FIGS. 4 and 5.
Figure 7:
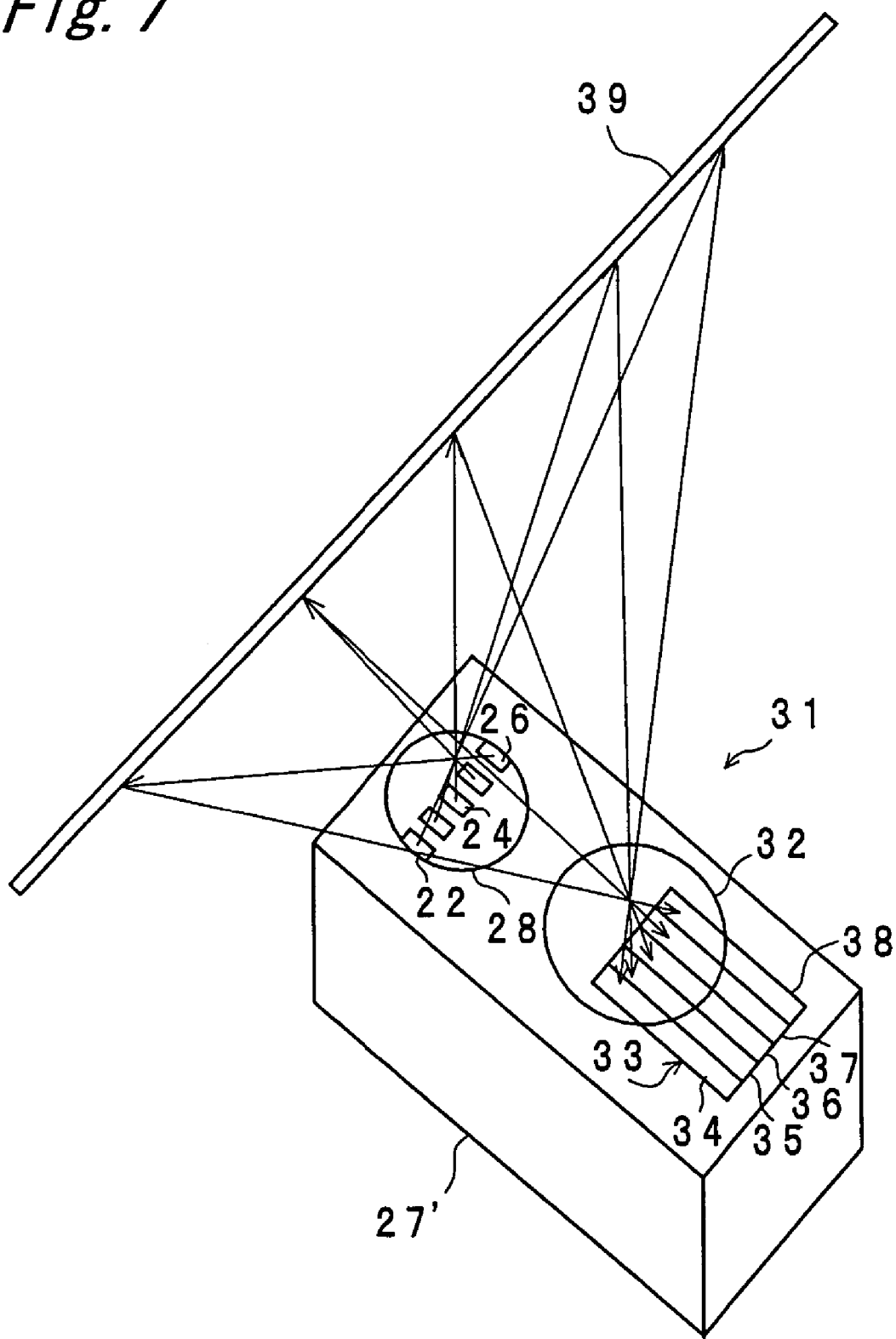
FIG. 7 is a view showing the situation in which a distance between an object and the multiple ranging apparatus is farther than the distance in FIG. 6.

FIGS. 6 and 7 show a schematic configuration of a multiple ranging apparatus 31 in which the light emitting device 21 configured as shown in FIGS. 4 and 5 is used. In the configuration of the multiple ranging apparatus 31, a light receiving lens 32 that functions as the light receiving lens 15 of the multiple ranging apparatus 11 and a one-dimensional PSD 33 that functions as the light receiving section 16 are provided respectively on and in extension part of transparent resin 27' that is extended on one end side of the transparent resin 27 constituting the light emitting device 21. The light receiving lens 32 is provided on a top surface of the extension part. The one-dimensional PSD 33 is provided in a position in the extension part where the one-dimensional PSD 33 can receive light from the light receiving lens 32. The one-dimensional PSD 33 is divided into five equal parts in the same direction as the arranged direction of the five LEDs 22-26. Each of the PSD parts 34-38 has a wavelength sensitivity corresponding to any one of five types of wavelengths of light emitted from the LEDs 22-26 and separately outputs electric signal to a signal processing device (not shown). Namely, in the first example, the wavelength-by-wavelength light receiving unit is composed of the plurality of PSD parts 34-38 having different wavelength sensitivities.

In the configuration shown in FIG. 6, the light rays of different wavelengths emitted from the LEDs 22-26 and are condensed by the lens 28 and then radiated in different directions. The light rays radiated in the different directions impinge on an object 39 and is diffusely reflected. Then, part of the diffusely reflected rays return to the multiple ranging apparatus 31 and are condensed by the light receiving lens 32. When the object 39 extends in the same direction as the arranged direction of the LEDs 22-26 and in parallel therewith, the rays condensed by the light receiving lens 32 form light spots on the corresponding PSD parts 34-38.

In this case, as shown in FIG. 6, the PSD part 34 has a wavelength sensitivity corresponding to a wavelength of light from the LED 22, the PSD part 35 has a wavelength sensitivity corresponding to light from the LED 23, the PSD part 36 has a wavelength sensitivity corresponding to light from the LED 24, the PSD parts 37 has a wavelength sensitivity corresponding to light from the LED 25, and the PSD parts 38 has a wavelength sensitivity corresponding to light from the LED 26. Accordingly, for example, the PSD part 34 is not activated even if light from the LEDs 23-26 other than the LED 22 is incident on the PSD part 34.

The signal processing device detects presence or absence of the object 39 in accordance with the amount of light received on the light spots formed on the PSD parts 34-38 on the basis of the electric signal outputted from the PSD parts 34-38. A position of the object 39 is detected as follows, on the basis of positions of the light spots on the PSD parts 34-38.

FIG. 7 shows a situation in which a distance between the object 39 and the multiple ranging apparatus 31 has increased in comparison with that in FIG. 6. In the case, the positions of the light spots formed on the PSD parts 34-38 are nearer to the LEDs 22-26 than those in FIG. 6. Therefore, the distances from the LEDs 22-26 (or from ends of the PSD parts 34-38 on sides of the LEDs 22-26) to the light spots formed on the PSD parts 34-38 are detected on the basis of the electric signals from the PSD parts 34-38, for example, and the position of the object 39 can thereby be detected.

On condition that the object 39 extends in the same direction as the arranged direction of the LEDs 22-26 and that distances from the LEDs 22-26 to the object 39 change uniformly (that is, on condition that the object 39 is inclined relative to a surface of the multiple ranging apparatus 31), the positions of the light spots formed on the PSD parts 34-38 also change uniformly. Therefore, the inclination of object 39 relative to the surface in which the LEDs 22-26 are arranged can also be detected on the basis of the change in the positions of the light spots.

In this example, as described above, the light emitting device 21 is formed by aligning the plurality of LEDs 22-26 which have the emission wavelengths different from one another. Also, the light receiving section is formed by aligning the plurality of PSD parts 34-38 which have the wavelength sensitivities corresponding to the different wavelengths of light emitted from the LEDs 22-26. Thus, even when ranging of respective points is simultaneously measured in multiple ranging measurement, it is possible to identify which LED the light is emitted from, and therefore, to simultaneously measure the distances of two or more points.

In this example, each of the PSD parts 34-38 is configured so as to have a wavelength sensitivity corresponding to any one of the five types of wavelengths of light emitted from the LEDs 22-26. However, even if the PSD parts 34-38 are configured so as to have the same wavelength sensitivity, the light rays of different wavelengths from the LEDs 22-26 can be separately received by the PSD parts 34-38 under the condition that the light rays from the LEDs 22-26 are separately incident on the PSD parts 34-38, respectively. It is needless to say that the PSD parts having the different wavelength sensitivities allows the light rays of the different wavelengths from the LEDs 22-26 to be more accurately-separated.

In this example, the PSD parts 34-38 are formed by dividing the single one-dimensional PSD 33 into the five equal parts. However, the PSD parts 34-38 may be formed by providing five PSDs side by side. The number of the PSD parts is not limited to five. If the number is six or more, it is possible to more precisely detect distances to points on an object.

SECOND EXAMPLE

Figure 8:
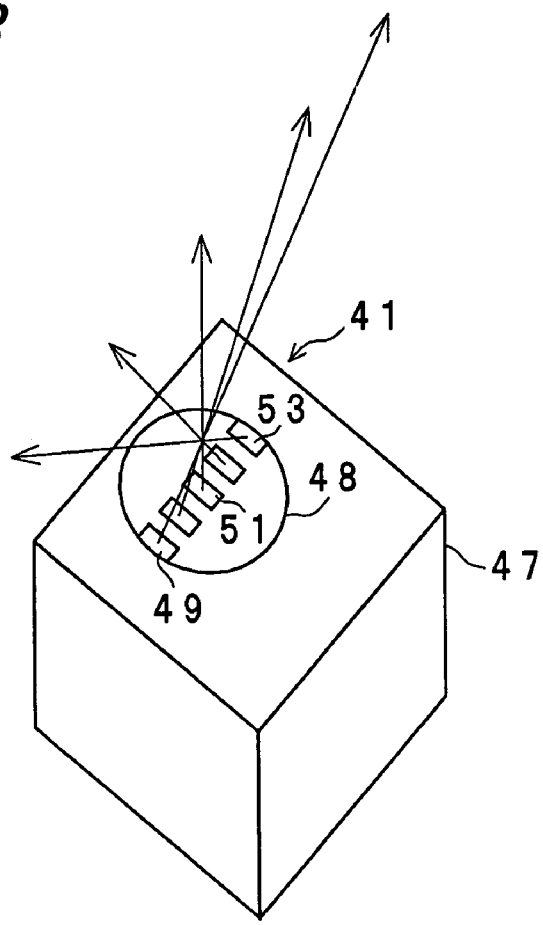
FIG. 8 is a perspective view of a light emitting device different from that of FIG. 4.
Figure 9:
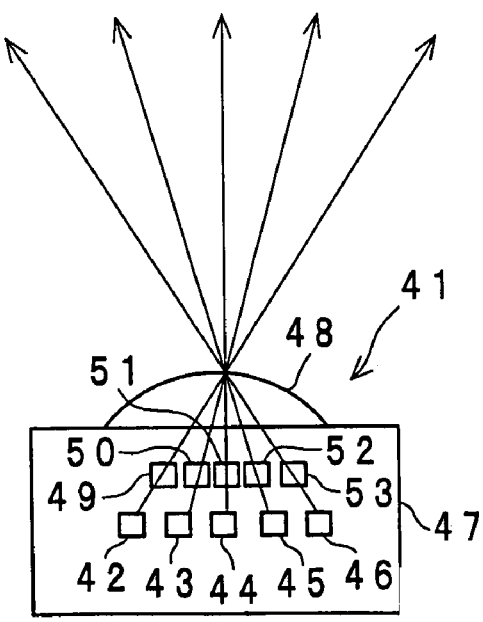
FIG. 9 is a vertical sectional view of the light emitting device shown in FIG. 8.

FIGS. 8 and 9 show a configuration of a light emitting device 41 in this example. In the light emitting device 41, five LEDs 42-46 are arranged in a row and are sealed with transparent resin 47. A lens 48 is formed on a top surface of the transparent resin 47 located over the LEDs 42-46. Light rays radiated from the LEDs 42-46 have the same wavelength. Chief rays from the LEDs 42-46 are on extension of lines connecting a center of the lens 48 and light emission positions of the LEDs 42-46. The lens 48 is arranged so that a principal axis thereof is superimposed on a chief ray from the LED 44 positioned at center.

At positions through which the chief rays extending from the LEDs 42-46 to the lens 48, optical filters 49-53 are provided which permit only light rays having specific wavelengths different from one another to pass through. Therefore, the light rays of the same wavelength emitted from the LEDs 42-46 are subjected to wavelength selection by the optical filters 49-53, and thereafter condensed by and radiated from the lens 48. Thus, five types of light rays having the different wavelengths are emitted from the light emitting device 41. That is to say, in this example, the wavelength multiplying unit is composed of the plurality of optical filters 49-53 which permit light rays having the specific wavelengths different from one another to pass through.

THIRD EXAMPLE

Figure 10:
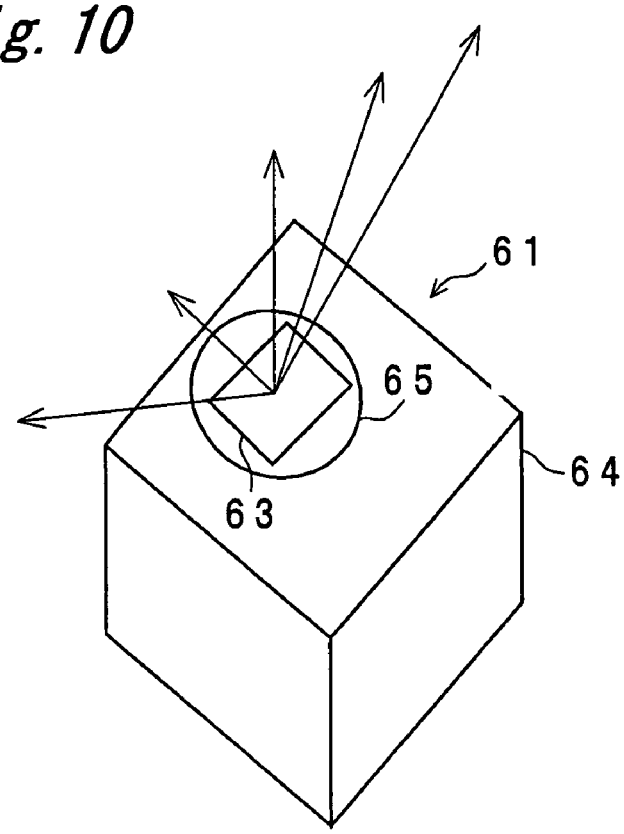
FIG. 10 is a perspective view of a light emitting device different from the devices of FIGS. 4 and 8.
Figure 11:
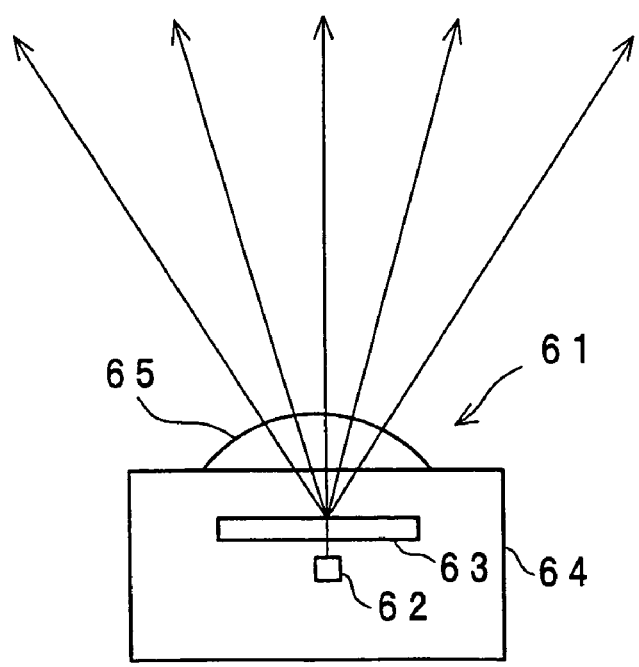
FIG. 11 is a vertical sectional view of the light emitting device shown in FIG. 10.

FIGS. 10 and 11 show a configuration of a light emitting device 61 in this example. In the light emitting device 61, one light emitting element 62 and a spectroscopic element 63 located over the light emitting element 62 are sealed with transparent resin 64. A lens 65 is formed on a top surface of the transparent resin 64 located over the spectroscopic element 63. The light emitting element 62 is composed of e.g. an LED. The spectroscopic element 63 is composed of e.g. a prism or a diffraction grating. That is to say, in this example, the wavelength multiplying unit is composed of the spectroscopic element 63.

In the configuration shown in FIGS. 10 and 11, a ray of light radiated from the light emitting element 62 is separated by the spectroscopic element 63 into light rays having a variety of wavelengths, and the light rays are condensed by the lens 65 so as to be radiated in different directions.

FOURTH EXAMPLE

Figure 12:
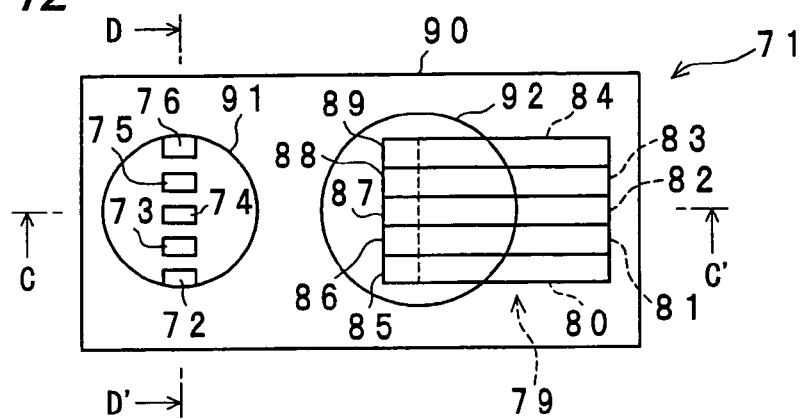
FIG. 12 is a plan view of a multiple ranging apparatus different from that of FIG. 6.
Figure 13:
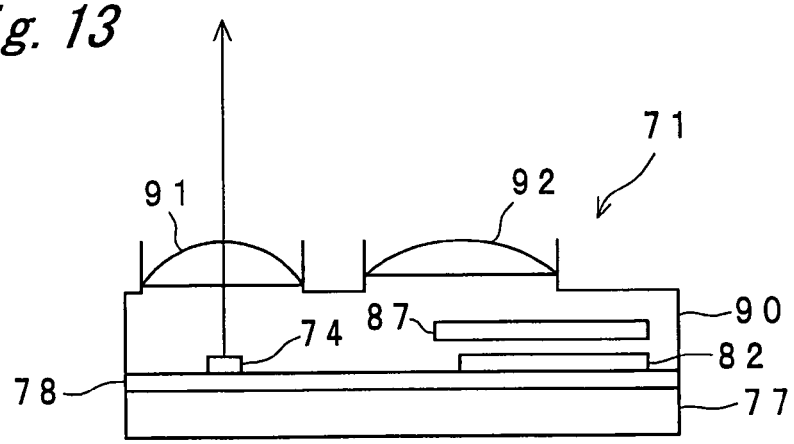
FIG. 13 is a sectional view taken along a line C-C' of FIG. 12.
Figure 14:
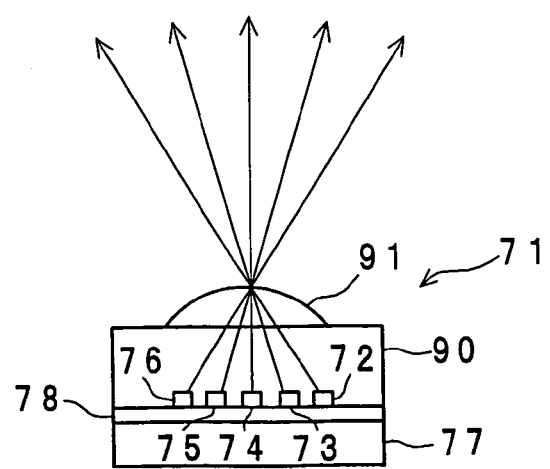
FIG. 14 is a sectional view taken along a line D-D' of FIG. 12.

FIGS. 12-14 show a configuration of a multiple ranging apparatus 71 in this example, where a light receiving section is installed. FIG. 12 is a perspective plan view thereof. FIG. 13 is a sectional view taken along a line C-C' of FIG. 12. FIG. 14 is a sectional view taken along a line D-D' of FIG. 12. A light emitting device in the multiple ranging apparatus 71 is identical to the light emitting device 21 in the first example and has five aligned LEDs 72-76 that radiate light rays with different wavelength. That is to say, in this example, the wavelength multiplying unit is composed of the plurality of LEDs 72-76 that emit light rays of wavelengths different from one another. Each of the LEDs 72-76 is placed on a frame 78 formed on a substrate 77.

A one-dimensional PSD 79 is placed on the frame 78. The one-dimensional PSD 79 is divided into five equal parts in the same direction as the direction in which the LEDs 72-76 are arranged. Thereby, the one-dimensional PSD 79 is composed of five PSD parts 80-84. Five optical filters 85-89 are provided over the PSD parts 80-84. The LEDs 72-76, the PSD parts 80-84 and the optical filters 85-89 are sealed with transparent resin 90. A lens 91 is formed on a top surface of the transparent resin 90 located over the LEDs 72-76. A light receiving lens 92 is formed in an area located over the optical filters 85-89.

In the configuration shown in FIGS. 12-14, light rays of the five wavelengths radiated from the LEDs 72-76 are condensed by the lens 91 and are then emitted in different directions. The emitted light rays impinge on an object and is diffusely reflected. Then, the light rays returned to the multiple ranging apparatus 71 via the object are condensed by the light receiving lens 92. The condensed light rays are subjected to wavelength selection by the optical filters 85-89, and then form light spots on the corresponding PSD parts 80-84. Consequently, on the basis of electric signals outputted from the PSD parts 80-84, presence or absence of the object can be detected in accordance with the amount of received light of the light spots formed on the PSD parts 80-84, and a position of the object can be detected in accordance with positions of the light spots on the PSD parts 80-84. That is to say, in this example, the wavelength-by-wavelength light receiving unit is composed of the plurality of optical filters 85-89 that select light rays of wavelengths different from one another.

As described above, the light receiving section in this example is composed of the PSD parts 80-84 and the optical filters 85-89. Therefore, the PSD parts 80-84 are not required to have wavelength sensitivities corresponding to wavelengths of light emitted from the LEDs 72-76 as in the first example, and thus the light receiving section can be formed at lower cost.

In this example, the PSD parts 80-84 are formed by dividing the single one-dimensional PSD 79 into the five equal parts. The PSD parts 80-84, however, may be formed by providing five PSDs side by side. The number of the PSD parts is not limited to five. If the number is six or more, it is possible to more precisely detect distances to points on an object.

FIFTH EXAMPLE

Figure 15:
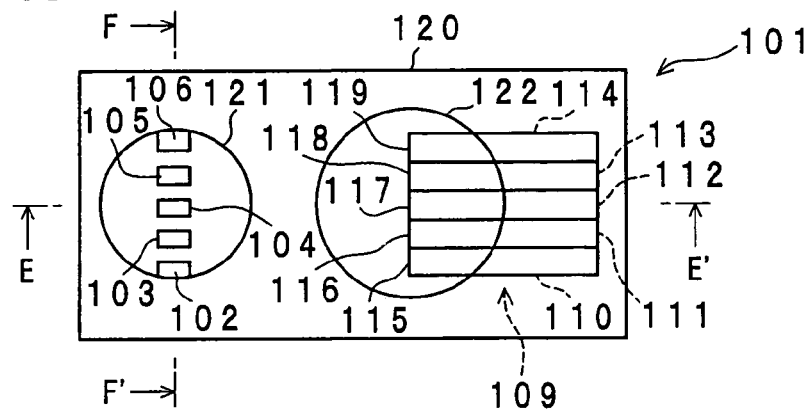
FIG. 15 is a plan view of a multiple ranging apparatus different from the apparatus of FIGS. 6 and 12.
Figure 16:
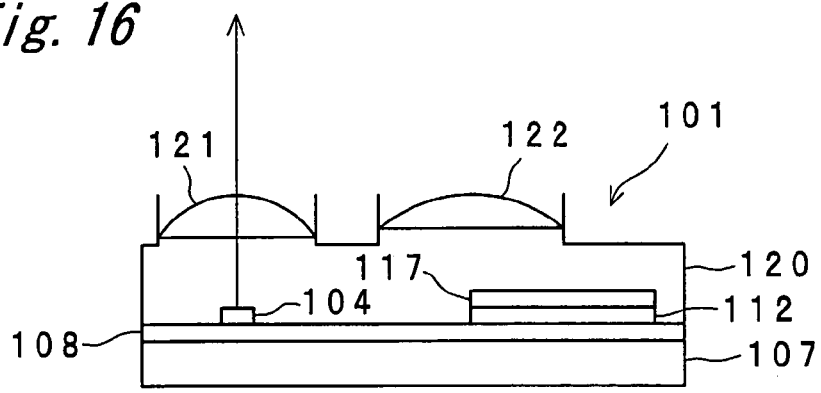
FIG. 16 is a sectional view taken along a line E-E' of FIG. 15.
Figure 17:
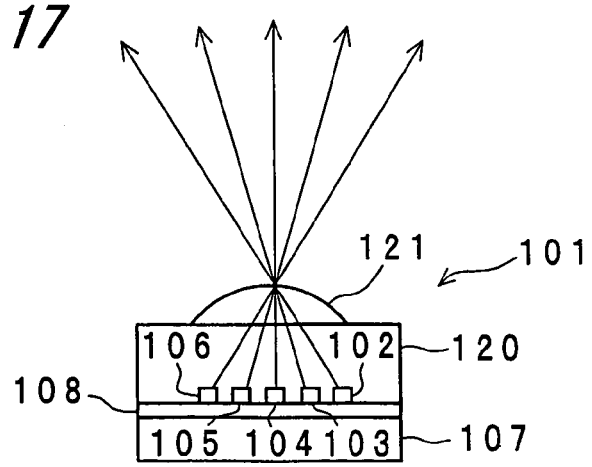
FIG. 17 is a sectional view taken along a line F-F' of FIG. 15.

FIGS. 15-17 show a schematic configuration of a multiple ranging apparatus 101 of the example in which a light receiving section is installed. FIG. 15 is a perspective plan view thereof. FIG. 16 is a sectional view taken along a line E-E' of FIG. 15. FIG. 17 is a sectional view taken along a line F-F' of FIG. 15. LEDs 102-106, a substrate 107, a frame 108, a one-dimensional PSD 109, PSD parts 110-114, transparent resin 120, a lens 121 and a light receiving lens 122 in the multiple ranging apparatus 101 are identical to the LEDs 72-76, the substrate 77, the frame 78, the one-dimensional PSD 79, the PSD parts 80-84, the transparent resin 90, the lens 91 and the light receiving lens 92, respectively, in the multiple ranging apparatus 71 of the fourth example.

Color filters 115-119 in this example are stuck on surfaces of the PSD parts 110-114 so as to mask the PSD parts 110-114, so that each of the filters permits any one of the light rays of five wavelengths radiated from the LEDs 102-106 to passage through. That is to say, in this example, the wavelength-by-wavelength light receiving unit is composed of the plurality of color filters 115-119 that permit the light rays of the wavelengths different from one another to pass through.

In the configuration shown in FIGS. 15 and 16, light rays of five wavelengths radiated from the LEDs 102-106 are condensed by the lens 121 and are then emitted in different directions. The emitted light rays impinge on an object and is diffusely reflected. Then, the light rays returned to the multiple ranging apparatus 101 via the object are condensed by the light receiving lens 122. The condensed light rays are subjected to wavelength selection by the color filters 115-119, and then form light spots on the corresponding PSD parts 110-114. Consequently, on the basis of electric signals outputted from the PSD parts 110-114, presence or absence of the object can be detected in accordance with the amount of received light of the light spots formed on the PSD parts 110-114, and a position of the object can be detected in accordance with positions of the light spots on the PSD parts 110-114.

As described above, the light receiving section in this example is composed of the PSD parts 110-114 and the color filters 115-119 for masking the PSD parts 110-114. Therefore, the PSD parts 110-114 are not required to have wavelength sensitivities corresponding to light rays from the LEDs 102-106 as in the first example, and thus the light receiving section can be composed at lower cost.

In this example, the PSD parts 110-114 are formed by dividing the single one-dimensional PSD 109 into five equal parts. The PSD parts 110-114, however, may be formed by providing five PSDs side by side. The number of the PSD parts is not limited to five. If the number is six or more, it is possible to more precisely detect distances to points on an object.

Second Embodiment

Figure 18:
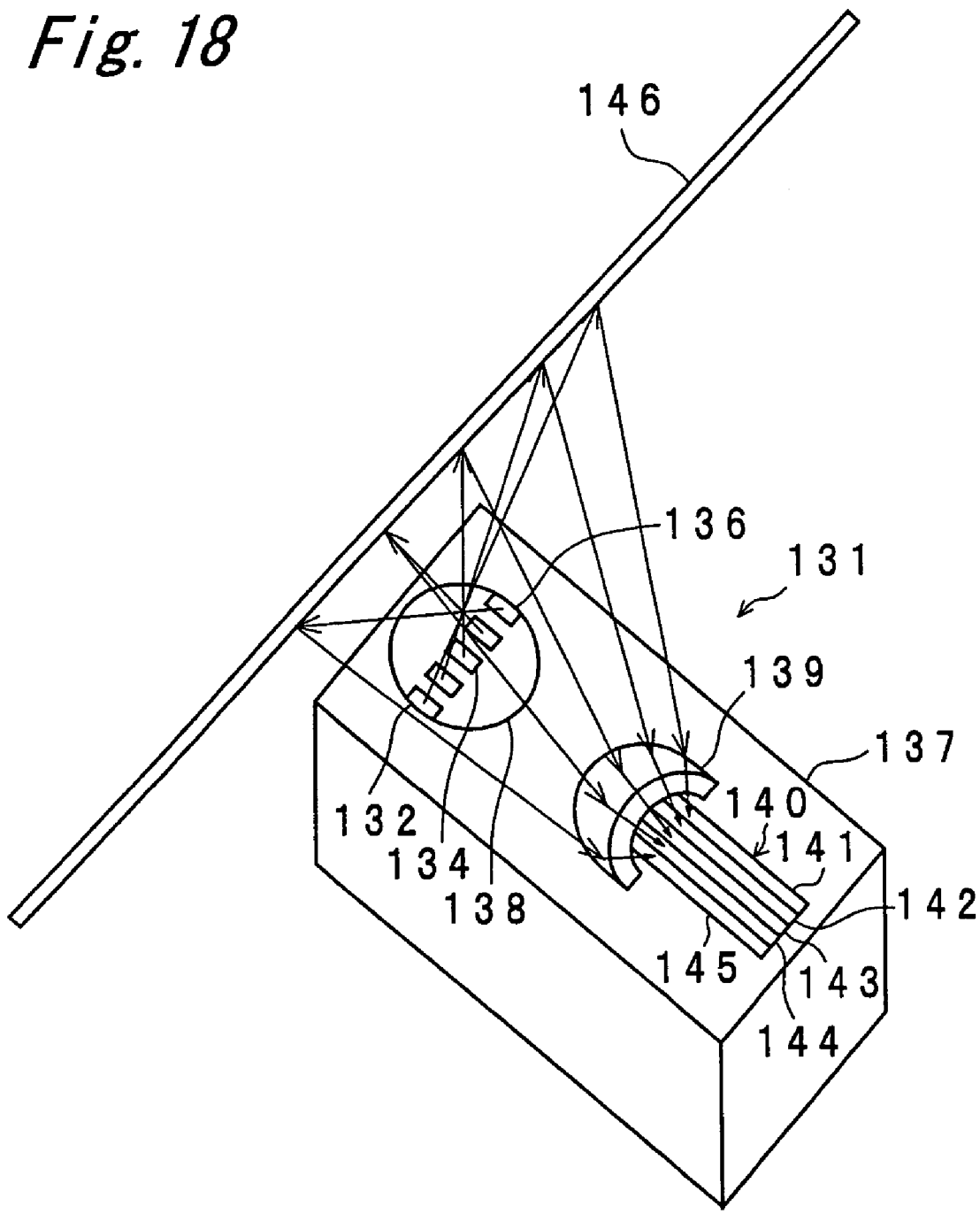
FIG. 18 is a perspective view of a multiple ranging apparatus different from the apparatus of FIGS. 6, 12, and 15.
Figure 19:
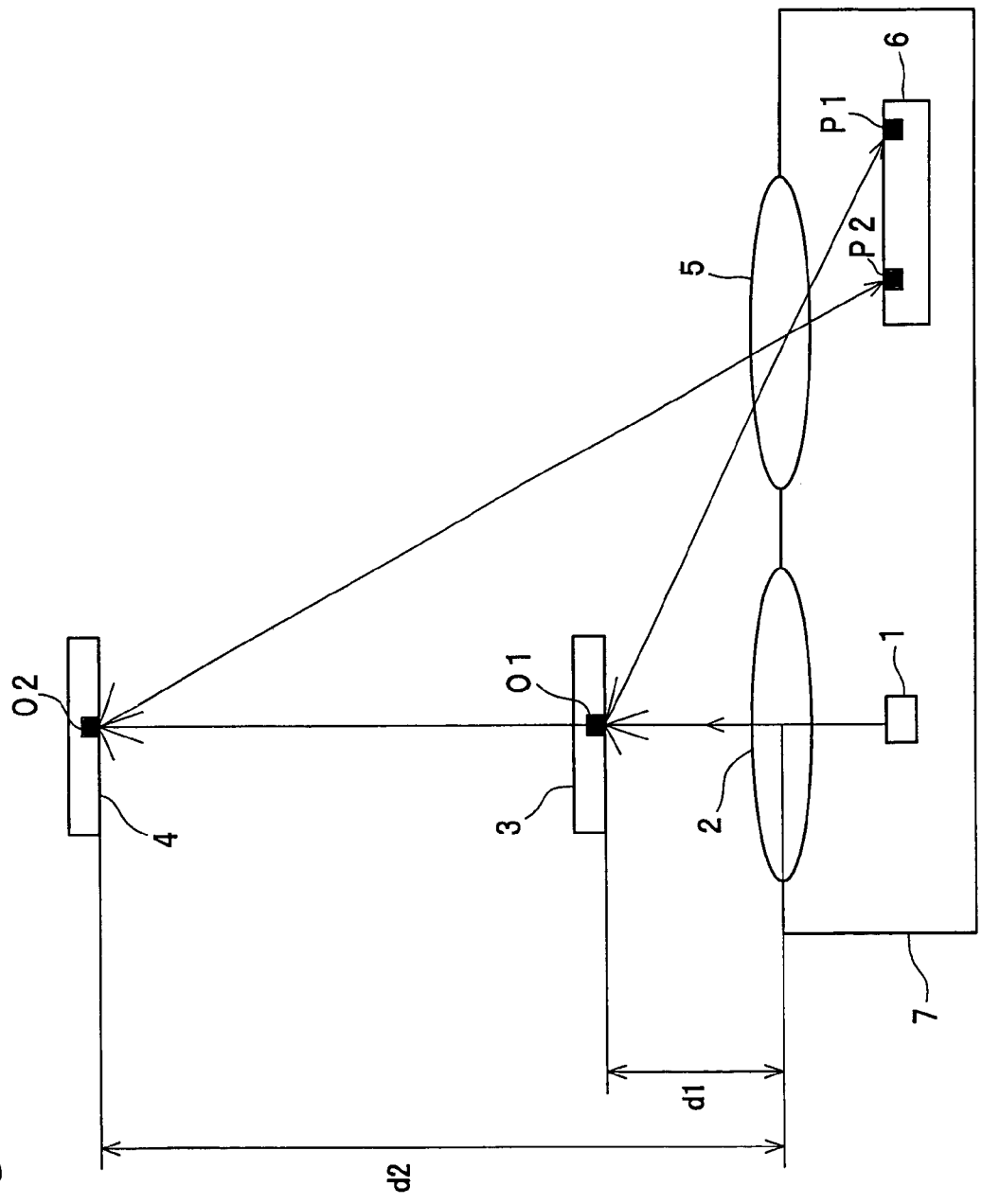
FIG. 19 is a diagram for describing operation of a multiple ranging apparatus of a conventional automatic focusing camera.

FIG. 18 shows a schematic configuration of a multiple ranging apparatus 131 in this embodiment. LEDs 132-136, transparent resin 137, a lens 138 and a one-dimensional PSD 140 are identical to the LEDs 22-26, the transparent resin 27, the lens 28, and the one-dimensional PSD 33, respectively, in the multiple ranging apparatus 71 in the first example shown in FIG. 6.

On a top surface of the transparent resin 137 is formed a toroidal lens 139 that functions as the light receiving lens 15 of the multiple ranging apparatus 11 shown in FIG. 1.

In the configuration shown in FIG. 18, five types of light rays of different wavelengths radiated from the LEDs 132-136 are condensed by the lens 138 and are then emitted in different directions. The emitted light rays impinge on an object 146 and is diffusely reflected. Then, the light rays returned to the multiple ranging apparatus 131 via the object are condensed on a surface of the one-dimensional PSD 140 by the toroidal lens 139. The condensed light rays form light spots on corresponding PSD parts 141-145. The PSD parts 141-145 have wavelength sensitivities corresponding to light rays from the LEDs 132-136. Accordingly, for example, the PSD part 141 is not activated even if light from the LEDs 133-136 other than the LED 132 is incident on the PSD part 141. Consequently, on the basis of electric signals outputted from the PSD parts 141-145, presence or absence of the object can be detected in accordance with the amount of received light of the light spots formed on the PSD parts 141-145, and a position of the object can be detected in accordance with positions of the light spots on the PSD parts 141-145.

In this embodiment, as described above, the toroidal lens 139 is used as a condensing unit for condensing reflected light from the object 146. Thereby, the reflected light from a wider area can effectively be condensed on the surface of the one-dimensional PSD 140, in comparison with configurations using conventional light receiving lenses. As a result, widths of the PSD parts 141-145 can be made smaller than those in the one-dimensional PSDs 33, 79, and 109 in the first embodiment, and a size of the multiple ranging apparatus 131 can thereby be reduced.

In this embodiment also, the PSD parts 141-145 may be configured so as to have a same wavelength sensitivity and may be formed by providing five PSDs side by side. The number of the PSD parts is not limited to five. It makes no problem to use color filters, optical filters or the like therewith. Besides, a light emitting device may be composed of one light emitting element and a spectroscopic element composed of a prism, a diffraction grating or the like.

Though the invention has been described as above, it is apparent that the invention may be changed in various manners. It should be understood that such changes are not regarded as departures from the spirit and the scope of the present invention and that all modifications obvious to those skilled in the art are included in the following claims.

What is claimed is:

1. A multiple ranging apparatus comprising:
   a light emitting section;
   an optical lens for beam-forming light emitted from the light emitting section;
   a condensing section for condensing part of light emitted from the light emitting section and diffusely reflected by an object to form light spots; and
   a light receiving section for outputting signals which represent:
   a) amounts of received light of the light spots formed by the condensing section, and
   b) positions of the light spots;
   wherein the light emitting section includes a wavelength multiplying unit for multiplying a wavelength of the emitted light; and
   wherein the light receiving section includes a wavelength-by-wavelength light receiving unit for separating and receiving the light rays having a plurality of wavelengths multiplied by the wavelength multiplying unit.

2. The multiple ranging apparatus as claimed in claim 1, wherein
the wavelength multiplying unit is formed by a plurality of light emitting elements which respectively emit light rays having wavelengths different from one another.

3. The multiple ranging apparatus as claimed in claim 1, wherein
the light receiving section includes a plurality of PSDs.

4. The multiple ranging apparatus as claimed in claim 3, wherein
the plurality of PSDs have wavelength sensitivities different from one another and constitute the wavelength-by-wavelength light receiving unit.

5. The multiple ranging apparatus as claimed in claim 1, wherein
the condensing section is formed by a convex lens.

6. The multiple ranging apparatus as claimed in claim 1, wherein
the condensing section is formed by a toroidal lens.

7. The multiple ranging apparatus as claimed in claim 1, wherein the wavelength multiplying unit is formed by a plurality of optical filters which permit light rays having wavelengths different from one another to pass through, and
wherein the light receiving section includes a plurality of PSDs.

* * * * *